United States Patent
Calkins et al.

(10) Patent No.: US 12,014,898 B2
(45) Date of Patent: Jun. 18, 2024

(54) ACTIVE TEMPERATURE CONTROL FOR RF WINDOW IN IMMERSED ANTENNA SOURCE

(71) Applicant: Applied Materials, Inc., Santa Clara, CA (US)

(72) Inventors: Adam Calkins, Newmarket, NH (US); Jeffrey E. Krampert, Topsfield, MA (US)

(73) Assignee: Applied Materials, Inc., Santa Clara, CA (US)

( * ) Notice: Subject to any disclaimer, the term of this patent is extended or adjusted under 35 U.S.C. 154(b) by 236 days.

(21) Appl. No.: 17/485,612

(22) Filed: Sep. 27, 2021

(65) Prior Publication Data

US 2023/0102972 A1   Mar. 30, 2023

(51) Int. Cl.
*H01J 37/32* (2006.01)
(52) U.S. Cl.
CPC ....... *H01J 37/3211* (2013.01); *H01J 37/3244* (2013.01); *H01J 37/32522* (2013.01); *H01J 37/32119* (2013.01)
(58) Field of Classification Search
CPC .............. H01J 37/3211; H01J 37/3244; H01J 37/32119; H01J 37/32183; H01J 37/32449; H01J 37/32522
See application file for complete search history.

(56) References Cited

U.S. PATENT DOCUMENTS

| 8,436,318 | B2 | 5/2013 | Sinclair et al. | |
| 11,114,284 | B2 * | 9/2021 | Collins | C23C 16/4584 |
| 2004/0050494 | A1 * | 3/2004 | Ohmi | C30B 25/105 |
| | | | | 118/723 MW |
| 2004/0123805 | A1 * | 7/2004 | Tomoyoshi | H01L 21/6831 |
| | | | | 118/724 |
| 2008/0088242 | A1 * | 4/2008 | Shun'ko | H01J 37/321 |
| | | | | 315/111.51 |

(Continued)

FOREIGN PATENT DOCUMENTS

| EP | 3745825 A1 | 12/2020 |
| JP | 2010225296 A | 10/2010 |
| TW | 201931416 A | 8/2019 |

OTHER PUBLICATIONS

International Search Report and Written Opinion dated Dec. 16, 2022, for the International Patent Application No. PCT/US2022/041675, filed on Aug. 26, 2022, 7 pages.

*Primary Examiner* — Tung X Le
(74) *Attorney, Agent, or Firm* — KDW Firm PLLC

(57) ABSTRACT

A processing system including an ion source having a plasma chamber to house a plasma, an extraction assembly, disposed along a side of the plasma chamber, and including at least one extraction aperture, and an antenna assembly extending through the plasma chamber. The antenna assembly may include a dielectric enclosure and a plurality of conductive antennas extending through the dielectric enclosure, the conductive antennas having respective gas ports formed therein for delivering a gas into the dielectric enclosure. The processing system may further include a temperature regulation system coupled to the conductive antennas and to the dielectric enclosure for monitoring a temperature of the dielectric enclosure and regulating the gas delivered to the conductive antennas for regulating the temperature of the dielectric enclosure.

20 Claims, 3 Drawing Sheets

(56) References Cited

U.S. PATENT DOCUMENTS

| | | | |
|---|---|---|---|
| 2008/0218086 A1* | 9/2008 | Sakai | H01J 37/32082 |
| | | | 315/111.21 |
| 2011/0076420 A1 | 3/2011 | Stowell | |
| 2014/0042902 A1* | 2/2014 | Fujita | H01J 37/32357 |
| | | | 315/34 |
| 2015/0179409 A1* | 6/2015 | Biloiu | H01J 37/32422 |
| | | | 427/523 |
| 2016/0027617 A1* | 1/2016 | Son | H01J 37/32935 |
| | | | 156/345.28 |
| 2017/0042010 A1* | 2/2017 | Liang | H01J 37/32009 |
| 2018/0218880 A1* | 8/2018 | Taniike | C23C 16/511 |
| 2019/0080948 A1* | 3/2019 | Lee | H01J 37/32724 |
| 2019/0088449 A1* | 3/2019 | Galstyan | H01J 37/32724 |
| 2019/0145005 A1 | 5/2019 | Outten | |
| 2022/0359166 A1* | 11/2022 | Tamari | H01J 37/32 |
| 2023/0005749 A1* | 1/2023 | Yamaguchi | H01L 21/67248 |

\* cited by examiner

ACTIVE TEMPERATURE CONTROL FOR RF WINDOW IN IMMERSED ANTENNA SOURCE

FIELD OF THE DISCLOSURE

The disclosure relates generally to processing apparatus for semiconductor devices, and more particularly to plasma-based ion sources.

BACKGROUND OF THE DISCLOSURE

In the present day, plasmas are used to process substrates, such as those used in electronic devices, for applications such as substrate etching, layer deposition, ion implantation, and other processes. Some processing apparatus employ a plasma chamber that generates a plasma to act as an ion source for substrate processing. An ion beam may be extracted through an extraction assembly and directed to a substrate in an adjacent chamber.

In various commercial systems, one or more antennas may be disposed within the plasma chamber, and may be referred to as internal antennas. The internal antennas may be housed within a tubular enclosure formed of a suitable dielectric material to act as a dielectric window. A power generator may be coupled to the internal antennas and may be used to ignite the plasma surrounding the dielectric window via inductive coupling between the internal antennas and the plasma.

Commonly, the internal surfaces of a plasma chamber and extraction assembly are cooled using water cooling systems to provide a more consistent, more uniform environment for plasma generation. The tubular, dielectric window housing the internal antennas in generally not cooled. The dielectric window may account for roughly 25% of the internal surfaces within the plasma chamber. Thus, without temperature regulation, the dielectric window may be subject to significant temperature variations, diminishing environmental uniformity within the plasma chamber and detrimentally affecting the ion beam extracted from the plasma chamber.

With respect to these and other considerations the present disclosure is provided.

BRIEF SUMMARY

This Summary is provided to introduce a selection of concepts in a simplified form. This Summary is not intended to identify key features or essential features of the claimed subject matter, nor is this Summary intended as an aid in determining the scope of the claimed subject matter.

An ion source including a plasma chamber to house a plasma, an extraction assembly, disposed along a side of the plasma chamber, and including at least one extraction aperture, and an antenna assembly extending through the plasma chamber. The antenna assembly may include a dielectric enclosure and a plurality of conductive antennas extending through the dielectric enclosure, the conductive antennas having respective gas ports formed therein for delivering a gas into the dielectric enclosure.

A processing system including an ion source having a plasma chamber to house a plasma, an extraction assembly, disposed along a side of the plasma chamber, and including at least one extraction aperture, and an antenna assembly extending through the plasma chamber. The antenna assembly may include a dielectric enclosure and a plurality of conductive antennas extending through the dielectric enclosure, the conductive antennas having respective gas ports formed therein for delivering a gas into the dielectric enclosure. The processing system may further include a temperature regulation system coupled to the conductive antennas and to the dielectric enclosure for monitoring a temperature of the dielectric enclosure and regulating the gas delivered to the conductive antennas for regulating the temperature of the dielectric enclosure.

A method of regulating a temperature within a plasma chamber of an ion source, the method including monitoring a temperature of a dielectric enclosure within the plasma chamber and flowing a gas into the dielectric enclosure via a plurality of conductive antennas extending through the dielectric enclosure.

BRIEF DESCRIPTION OF THE DRAWINGS

The accompanying drawings illustrate exemplary approaches of the present disclosure, including the practical application of the principles thereof, as follows.

Figure 1:
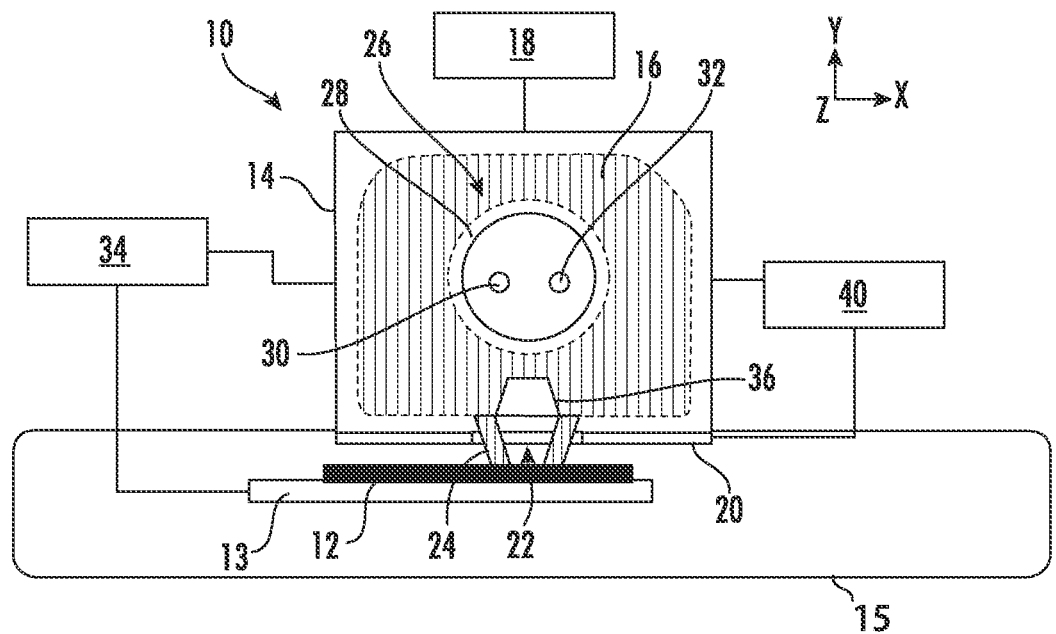
FIG. 1 is an end-on view illustrating an exemplary system, in a first configuration, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The apparatus, system and method may be embodied in many different forms and are not be construed as being limited to the embodiments set forth herein. Instead, these embodiments are provided so this disclosure will convey certain exemplary aspects of the apparatus, system, and method to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for achieving improved temperature uniformity in processing apparatus, and in particular in compact ion beam processing apparatus. The present embodiments may be suitable for applications where temperature consistency and uniformity within a plasma chamber are useful.

FIG. 1 illustrates an end-on view of an exemplary system, in a first configuration, according to embodiments of the disclosure. The system will be referred to herein as "the processing system 10" and is suitable for ion beam processing of a substrate 12 supported on a substrate holder 13 within a process chamber 15. The processing system 10 may include a plasma chamber 14 to house a plasma 16, a power generator 18, coupled to deliver power to generate the plasma 16, when a suitable gaseous species (not separately shown) is delivered to the plasma chamber 14. The power generator 18 may be an RF power generator, for example.

In order to process the substrate 12, an extraction assembly 20 is provided along a side of the plasma chamber 14, where the extraction assembly 20 includes at least one extraction aperture 22 that generates one or more corresponding ion beams 24. In the example of FIG. 1, for purposes of explanation, one extraction aperture 22 is depicted, while any suitable number of extraction apertures may be included in an extraction assembly according to the present embodiments.

The processing system 10 further includes an antenna assembly 26, where the antenna assembly 26 extends through the plasma chamber 14, parallel to a first axis (in this case, the Z-axis of the Cartesian coordinate system shown). The antenna assembly 26 includes a dielectric enclosure 28 formed of a suitable insulating material for acting as a dielectric window. Examples of such materials include, and are not limited to, alumina, alumina nitride, and ceramic. The antenna assembly 26 may further include a plurality of conductive antennas, extending parallel to the first axis (Z-axis) within the dielectric enclosure 28. In the example shown, the plurality of conductive antennas includes a first antenna 30 and a second antenna 32. The present disclosure is not limited in this regard.

As such, the power generator 18, plasma chamber 14, antenna assembly 26, and extraction assembly 20 may constitute an ion source used to generate at least one ion beam for processing of the substrate 12. In operation, the power generator 18 is coupled to the first antenna 30 and the second antenna 32, to power the plasma 16, such as through inductive coupling of the first antenna 30 and the second antenna 32 to the plasma 16. More particularly, when process gas is directed into the plasma chamber 14, power is applied to the first antenna 30 and the second antenna 32, causing the plasma 16 in the plasma chamber 14 to be ignited.

When a bias voltage is applied by an extraction voltage supply 34, between the plasma chamber 14 and the substrate 12, or the substrate holder 13, ion beam(s) 24 are extracted through the extraction apertures 22 and are directed to the substrate 12. In various embodiments, the extraction voltage supply 34 may operate to apply a pulsed DC bias voltage or an RF bias voltage, between the plasma chamber 14 and the substrate 12 (or substrate holder 13). Moreover, in some embodiments the extraction assembly 20 may include one or more beam blockers 36 disposed within the plasma chamber 14, adjacent the extraction aperture 22, for extracting angled ion beams 24 through the extraction aperture 22, where the ion beams 24 may form non-zero angles of incidence with respect to a plane defined by a top surface of the substrate (i.e., a plane parallel to the X-axis of the Cartesian coordinate system shown).

The processing system 10 may further include a liquid cooling system 40 coupled to the plasma chamber 14 and to the extraction assembly 20. The liquid cooling system 40 may be adapted to circulate water or another cooling fluid through the plasma chamber 14 and the extraction assembly 20 to draw heat therefrom and regulate the temperatures of surfaces within the plasma chamber 14. Such cooling systems will be familiar to those of ordinary skill in the art and will not be described in further detail herein.

Figure 2:
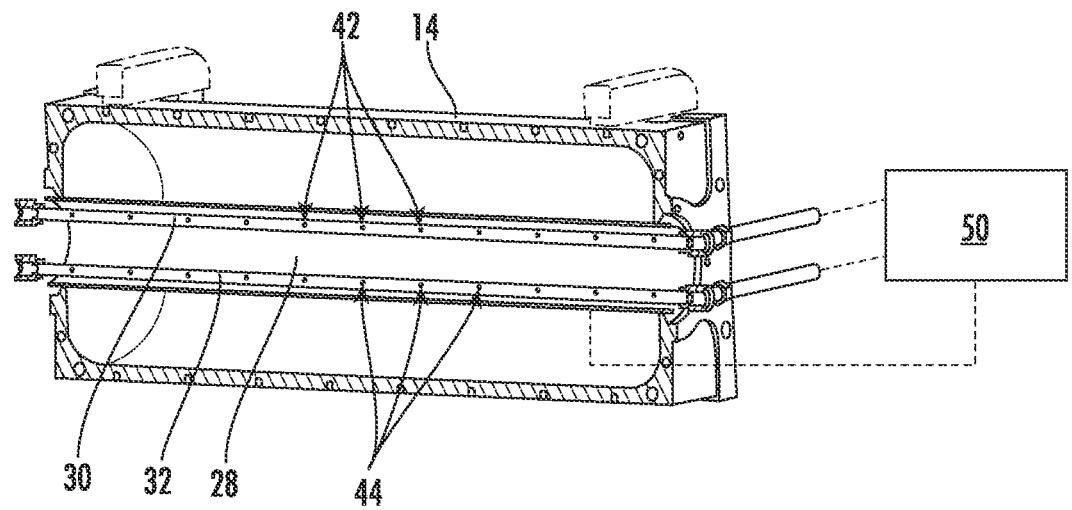
FIG. 2 is cross-sectional view illustrating a plasma chamber and antenna assembly, in a first configuration, according to embodiments of the present disclosure.

Referring to FIG. 2, a cross-sectional view illustrating the plasma chamber 14 and antenna assembly 26 of the processing system 10 is shown. As shown in this view, the first and second antennas 30, 32 may be hollow, tubular bodies having respective series of longitudinally spaced-apart gas ports 42, 44 formed therein. The first and second antennas 30, 32 may thus be used as gas manifolds for delivering a heating gas or a cooling gas to the interior of the dielectric enclosure 28 for regulating the temperature of the dielectric enclosure 28 as further described below.

The processing system 10 may further include a temperature regulation system 50 coupled to the first and second antennas 30, 32 and to the dielectric enclosure 28. As will be described in greater detail below, the temperature regulation system 50 may monitor a temperature of the dielectric enclosure 28 and may control the temperature and flow of a heating or cooling gas to the first and second antennas 30, 32 for regulating the temperature of the dielectric enclosure 28. In various embodiments, the temperature regulation system 50 may be integral to the processing system 10 (e.g., "onboard" the processing system 10) or may be located adjacent or distant from the processing system 10 and coupled to the first and second antennas 30, 32 and to the dielectric enclosure 28 by hoses and leads, for example. The present disclosure is not limited in this regard.

Figure 3:
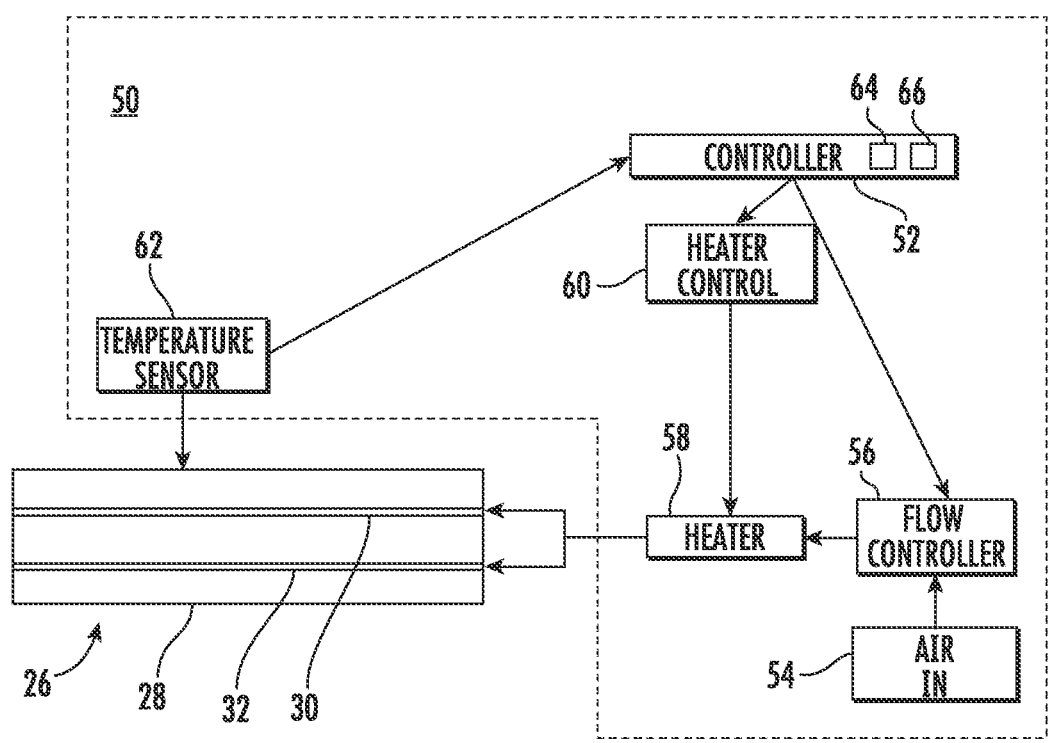
FIG. 3 is a schematic diagram illustrating components of a temperature regulation system, in a first configuration, according to embodiments of the present disclosure.

Turning now to FIG. 3, a schematic diagram illustrating components of the temperature regulation system 50 and the connections of such components to the antenna assembly 26 and the dielectric enclosure 28 is shown. The temperature regulation system 50 may include a main controller 52, an air intake 54, a flow controller 56, a heater 58, a heater control 60, and a temperature sensor 62. The main controller 52 may be coupled to these components, for example, to send control signals and to receive signals from the components. The main controller 52 may include a processor 64, such as a known type of microprocessor, dedicated semiconductor processor chip, general purpose semiconductor processor chip, or similar device. The flow controller 56 and the heater control 60 may include similar processors (not separately shown) for executing instructions received from the main controller 52. The main controller 52 may further include a memory or memory unit 66, coupled to the processor 64, where the memory unit 66 contains a control routine. The control routine may be operative on the processor 64 to monitor and adjust a temperature of the dielectric enclosure 28, as described below.

The memory unit 66 may comprise an article of manufacture. In one embodiment, the memory unit 66 may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

In operation, the temperature sensor 62 may periodically or continuously monitor a temperature of the dielectric enclosure 28 and may communicate the monitored temperature to the main controller 52. The main controller 52 may compare, by way of the processor 64 and the memory unit 66, the monitored temperature to a predetermined or desired temperature or temperature range (hereinafter referred to as "the target temperature"). In various embodiments, the target temperature may be derived from a real time temperature within the plasma chamber 14. Based on the comparison performed by the main controller 52, the main controller 52 may direct the flow controller 56 to adjust the flow of gas (e.g., ambient air or other inert gas) from the air intake to the heater 58, and/or may direct the heater control 60 to adjust the amount of heating applied to the gas via the heater 58.

In one example, if the main controller 52 determines that the temperature of the dielectric enclosure 28 is above the target temperature, the main controller 52 may direct the flow controller 56 to increase the flow of gas to the heater 58 and/or may direct the heater control 60 to decrease (or entirely suspend) heating of the gas via the heater 58. Conversely, if the main controller 52 determines that the temperature of the dielectric enclosure 28 is below the target temperature, the main controller 52 may direct the flow controller 56 to decrease the flow of gas to the heater 58 and/or may direct the heater control 60 to increase heating of the gas via the heater 58. The temperature regulated gas is then fed into the dielectric enclosure 28 via the first and second antennas 30, 32, thus heating or cooling the dielectric enclosure 28 as necessary. For example, the dielectric enclosure 28 may be heated or cooled to a temperature equal to, or nearly equal to, the temperatures of other surfaces within the plasma chamber 14 to provide greater temperature uniformity within the plasma chamber 14.

Figure 4:
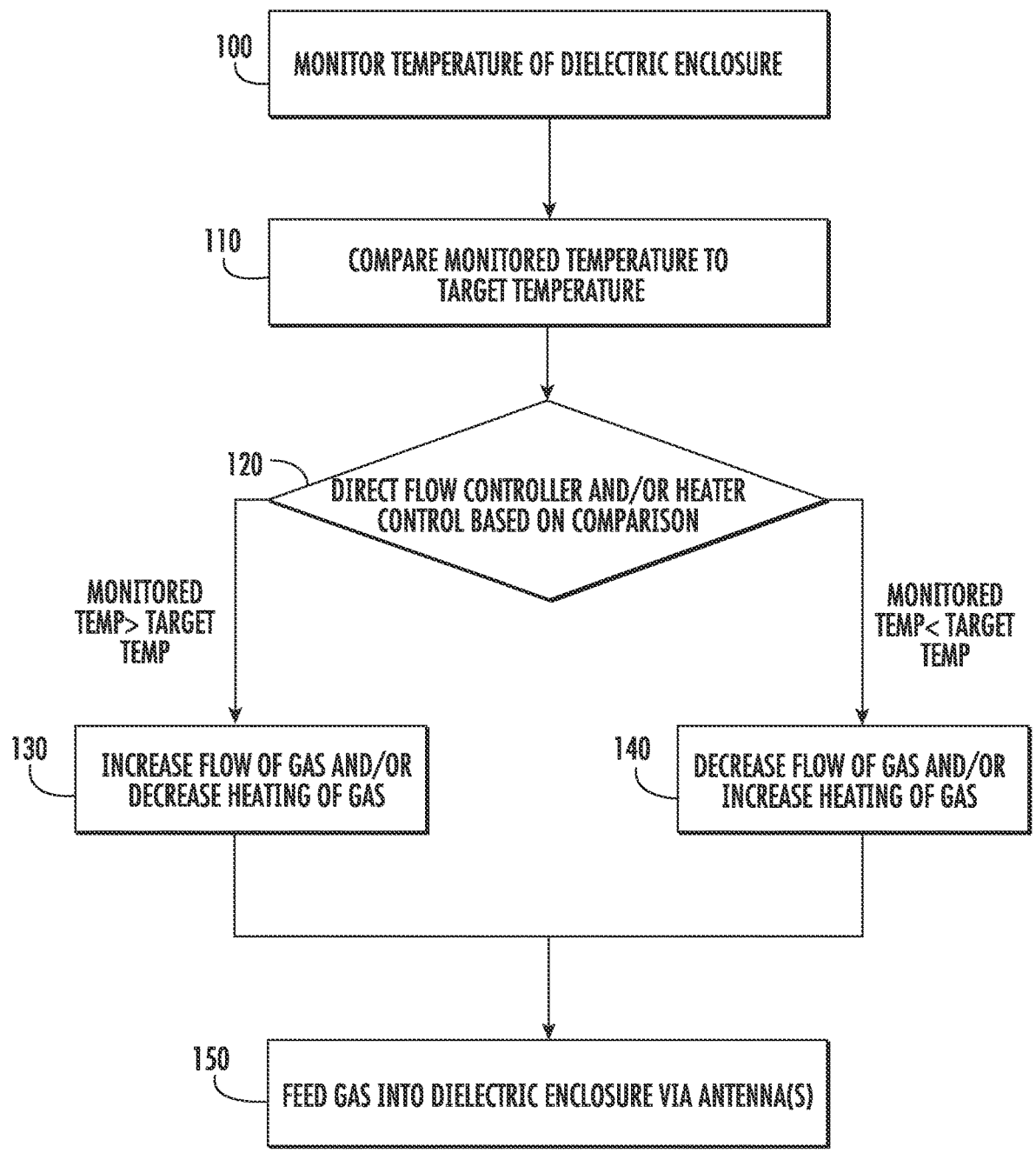
FIG. 4 is a block diagram illustrating an exemplary method for regulating the temperature of a dielectric enclosure in accordance with embodiments of the present disclosure.

Referring to FIG. 4, a flow diagram illustrating an exemplary method for regulating the temperature of a dielectric enclosure within an ion beam processing system in accordance with the present disclosure is shown. The method will now be described in conjunction with the illustrations of the processing system 10 and temperature regulation system 50 shown in FIGS. 1-3.

At block 100 of the exemplary method, the temperature sensor 62 of the temperature regulation system 50 may periodically or continuously monitor a temperature of the dielectric enclosure 28 and may communicate the monitored temperature to the main controller 52. At block 110 of the method, the main controller 52 may compare the monitored temperature to a target temperature (a specific value or range). In various embodiments, the target temperature may be derived from a real time temperature within the plasma chamber 14.

At block 120 of the exemplary method, the main controller 52 may, based on the comparison performed in block 110, direct the flow controller 56 to adjust the flow of gas (e.g., ambient air or other inert gas) from the air intake to the heater 58, and/or may direct the heater control 60 to adjust the amount of heating applied to the gas via the heater 58. For example, if the main controller 52 determines that the temperature of the dielectric enclosure 28 is above the target temperature, the main controller 52 may, at block 130 of the exemplary method, direct the flow controller 56 to increase the flow of gas to the heater 58 and/or may direct the heater control 60 to decrease (or entirely suspend) heating of the gas via the heater 58. Conversely, if the main controller 52 determines that the temperature of the dielectric enclosure 28 is below the target temperature, the main controller 52 may, at block 140 of the exemplary method, direct the flow controller 56 to decrease the flow of gas to the heater 58 and/or may direct the heater control 60 to increase heating of the gas via the heater 58.

At block 150 of the exemplary method, the temperature regulated gas prepared at block 130 or block 140 of the method is fed into the dielectric enclosure 28 via the first and second antennas 30, 32, thus heating or cooling the dielectric enclosure 28 as necessary.

In view of the above, the present disclosure provides at least the following advantages. As a first advantage, the present embodiments provide greater environmental uniformity within a plasma chamber of an ion beam processing system for improving the quality of an ion beam extracted from the plasma chamber. As a second advantage, the present embodiments can be implemented without significantly altering the structure, configuration, or footprint of existing ion beam processing systems.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An ion source, comprising:
 a plasma chamber to house a plasma;
 an extraction assembly, disposed along a side of the plasma chamber, and comprising at least one extraction aperture; and
 an antenna assembly extending through the plasma chamber and comprising:
  a dielectric enclosure; and
  a plurality of conductive antennas extending through the dielectric enclosure, the plurality of conductive antennas having respective gas ports formed therein for delivering a gas into the dielectric enclosure.

2. The ion source of claim 1, wherein the plurality of conductive antennas are hollow, tubular bodies.

3. The ion source of claim 1, further comprising a beam blocker disposed within the plasma chamber, adjacent the extraction aperture, for extracting angled ion beams through the extraction aperture.

4. The ion source of claim 1, further comprising a power generator coupled to the plasma chamber for generating the plasma.

5. A processing system, comprising:
 an ion source, comprising:
  a plasma chamber to house a plasma;
  an extraction assembly, disposed along a side of the plasma chamber, and comprising at least one extraction aperture; and
  an antenna assembly extending through the plasma chamber and comprising:
   a dielectric enclosure; and
   a plurality of conductive antennas extending through the dielectric enclosure, the plurality of conductive antennas having respective gas ports formed therein for delivering a gas into the dielectric enclosure; and
 a temperature regulation system coupled to the plurality of conductive antennas and to the dielectric enclosure for monitoring a temperature of the dielectric enclosure and regulating the gas delivered to the plurality of conductive antennas for regulating the temperature of the dielectric enclosure.

6. The processing system of claim 5, wherein the temperature regulation system comprises: a heater for heating the gas delivered to the plurality of conductive antennas; and a heater control for controlling operation of the heater.

7. The processing system of claim 5, wherein the temperature regulation system comprises a flow controller for regulating a flow of the gas delivered to the plurality of conductive antennas.

8. The processing system of claim 5, wherein the temperature regulation system comprises a temperature sensor for monitoring the temperature of the dielectric enclosure.

9. The processing system of claim 5, wherein the temperature regulation system comprises:
   a heater for heating the gas delivered to the conductive antennas;
   a heater control for controlling operation of the heater;
   a flow controller for regulating a flow of the gas delivered to the plurality of conductive antennas;
   a temperature sensor for monitoring the temperature of the dielectric enclosure; and
   a main controller connected to the heater control, the flow controller, and temperature sensor, the main controller adapted to dictate operation of the heater control and the flow controller based on the temperature monitored by the temperature sensor.

10. The processing system of claim 9, wherein the main controller is adapted to direct the flow controller to increase the flow of gas to the plurality of conductive antennas if the temperature of the dielectric enclosure is above a target temperature.

11. The processing system of claim 9, wherein the main controller is adapted to direct the flow controller to decrease the flow of gas to the plurality of conductive antennas if the temperature of the dielectric enclosure is below a target temperature.

12. The processing system of claim 9, wherein the main controller is adapted to direct the heater control to decrease or entirely suspend heating of the gas via the heater if the temperature of the dielectric enclosure is above a target temperature.

13. The processing system of claim 9, wherein the main controller is adapted to direct the heater control to increase heating of the gas via the heater if the temperature of the dielectric enclosure is below a target temperature.

14. A method of regulating a temperature within a plasma chamber of an ion source, the method comprising:
   monitoring a temperature of a dielectric enclosure within the plasma chamber; and
   flowing a gas into the dielectric enclosure via a plurality of conductive antennas extending through the dielectric enclosure, the plurality of conductive antennas having respective gas ports formed therein for delivering the gas into the dielectric enclosure.

15. The method of claim 14, further comprising regulating at least one of a temperature and a flow of the gas based on the monitored temperature of the dielectric enclosure.

16. The method of claim 14, further comprising comparing the monitored temperature of the dielectric enclosure to a predetermined target temperature.

17. The method of claim 14, further comprising comparing the monitored temperature of the dielectric enclosure to a target temperature and increasing the flow of gas to dielectric enclosure if the temperature of the dielectric enclosure is above the target temperature.

18. The method of claim 14, further comprising comparing the monitored temperature of the dielectric enclosure to a target temperature and decreasing the flow of gas to dielectric enclosure if the temperature of the dielectric enclosure is below the target temperature.

19. The method of claim 14, further comprising comparing the monitored temperature of the dielectric enclosure to a target temperature and decreasing heating of the gas delivered to the dielectric enclosure if the temperature of the dielectric enclosure is above the target temperature.

20. The method of claim 14, further comprising comparing the monitored temperature of the dielectric enclosure to a target temperature and increasing heating of the gas delivered to the dielectric enclosure if the temperature of the dielectric enclosure is below the target temperature.

* * * * *